(12) United States Patent
Lee

(10) Patent No.: US 12,382,715 B2
(45) Date of Patent: Aug. 5, 2025

(54) POWER SEMICONDUCTOR DEVICE

(71) Applicants: HYUNDAI MOTOR COMPANY, Seoul (KR); KIA CORPORATION, Seoul (KR)

(72) Inventor: Jong Seok Lee, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 421 days.

(21) Appl. No.: 18/115,165

(22) Filed: Feb. 28, 2023

(65) Prior Publication Data

US 2024/0136355 A1 Apr. 25, 2024
US 2024/0234416 A9 Jul. 11, 2024

(30) Foreign Application Priority Data

Oct. 24, 2022 (KR) .................. 10-2022-0137556

(51) Int. Cl.
| | |
|---|---|
| *H01L 27/092* | (2006.01) |
| *H01L 21/8238* | (2006.01) |
| *H10D 84/01* | (2025.01) |
| *H10D 84/03* | (2025.01) |
| *H10D 84/85* | (2025.01) |

(52) U.S. Cl.
CPC ......... *H10D 84/85* (2025.01); *H10D 84/0167* (2025.01); *H10D 84/038* (2025.01)

(58) Field of Classification Search
CPC .... H10D 84/85; H10D 30/668; H10D 64/513; H10D 62/127; H10D 62/8325; H10D 84/017
See application file for complete search history.

(56) References Cited

U.S. PATENT DOCUMENTS

| | | |
|---|---|---|
| 7,238,996 B2 | 7/2007 | Kimizuka et al. |
| 8,097,512 B2 | 1/2012 | Li et al. |
| 8,415,753 B2 | 4/2013 | Nakagawa et al. |
| 8,686,544 B2 | 4/2014 | Harafuji et al. |
| 9,647,108 B2 | 5/2017 | Suzuki et al. |
| 10,224,321 B2 | 3/2019 | Hebert |

(Continued)

FOREIGN PATENT DOCUMENTS

| | | |
|---|---|---|
| JP | 2005-340329 A | 12/2005 |
| JP | 4871433 B2 | 2/2012 |

(Continued)

*Primary Examiner* — John A Bodnar
(74) *Attorney, Agent, or Firm* — MCDONNELL BOEHNEN HULBERT & BERGHOFF LLP

(57) ABSTRACT

A power semiconductor device includes a silicon carbide (SiC) semiconductor layer, a first gate and a second gate buried in the semiconductor layer, a first base region positioned at least at one side of the first gate and having a first conductive type, a second base region positioned at least at one side of the second gate and a second conductive type, a first source region positioned at least at one side of the first gate to make contact with the first base region and the second base region and having the second conductive type, a second source region positioned at least at one side of the second gate to make contact with the first base region and the second base region and having the first conductive type, and a source electrode positioned over the semiconductor layer to make contact with the first source region and the second source region.

19 Claims, 22 Drawing Sheets

(56) References Cited

U.S. PATENT DOCUMENTS

| | | | |
|---|---|---|---|
| 10,580,769 | B2 | 3/2020 | Hebert |
| 2005/0263802 | A1 | 12/2005 | Kimizuka et al. |
| 2012/0037983 | A1 | 2/2012 | Hshieh |
| 2012/0043617 | A1 | 2/2012 | Nakagawa et al. |
| 2016/0247910 | A1 | 8/2016 | Suzuki et al. |
| 2018/0090612 | A1* | 3/2018 | Fujiwara .............. H10D 64/513 |

FOREIGN PATENT DOCUMENTS

| | | |
|---|---|---|
| JP | 2015-072999 A | 4/2015 |
| KR | 10-1999407 B1 | 10/2019 |
| KR | 10-2330787 B1 | 11/2021 |

* cited by examiner

POWER SEMICONDUCTOR DEVICE

CROSS REFERENCE TO RELATED APPLICATIONS

This application claims the benefit of priority to Korean Patent Application No. 10-2022-0137556, filed in the Korean Intellectual Property Office on Oct. 24, 2022, the entire contents of which are incorporated herein by reference.

TECHNICAL FIELD

The present disclosure relates to a semiconductor device, and more particularly relates to a power semiconductor device capable of reducing power loss by allowing a current to smoothly flow in a forward direction or a reverse direction.

BACKGROUND

A power semiconductor device refers to a semiconductor device that operates in a high-voltage and high-current environment. The power semiconductor device has been used in a field requiring high power switching. For example, the power semiconductor device has been used in power conversion, a power converter, or an inverter. For example, the power semiconductor device may include an insulated gate bipolar transistor (IGBT), or a metal oxide semiconductor field effect transistor (MOSFET). The power semiconductor device basically requires a withstand voltage characteristic against a higher voltage. In addition, recently, the power semiconductor device has additionally required a high-speed switching operation.

As such, a power semiconductor device that uses silicon carbide (SiC) instead of existing silicon (Si) is being developed. Silicon carbide (SiC), which is a wide gap semiconductor material having a band gap higher than that of silicon, may maintain stability even at a higher temperature, as compared to silicon. Further, silicon carbide (SiC) exhibits a dielectric breakdown field remarkably higher than that of silicon (Si). Accordingly, silicon carbide (SiC) may stably work even at a higher voltage. Therefore, silicon carbide (SiC) has a higher breakdown voltage than that of silicon (Si), and exhibits excellent heat dissipation. Accordingly, silicon carbide (SiC) is able to operate at a high temperature.

To increase a channel density of a power semiconductor device based on silicon carbide (SiC), a trench type of gate structure having a vertical channel structure has been studied.

SUMMARY

The present disclosure has been made to solve the above-mentioned problems occurring in the prior art while advantages achieved by the prior art are maintained intact.

An aspect of the present disclosure is to provide a power semiconductor device including silicon carbide (SiC), capable of reducing power loss by allowing a current to smoothly flow in a forward direction or a reverse direction.

The technical problems to be solved by the present disclosure are not limited to the aforementioned problems, and any other technical problems not mentioned herein will be clearly understood from the following description by those skilled in the art to which the present disclosure pertains.

According to an embodiment of the present disclosure, a power semiconductor device may include a silicon carbide (SiC) semiconductor layer, a first gate buried in a semiconductor layer, a second gate buried in the semiconductor layer to be separated from the first gate, a first base region positioned at least at one side of the first gate and having a first conductive type, and a second base region positioned at least at one side of the second gate and a second conductive type opposite to the first conductive type, a first source region positioned at least at one side of the first gate to make contact with the first base region and the second base region and having the second conductive type, a second source region positioned at least at one side of the second gate to make contact with the first base region and the second base region and having the first conductive type, and a source electrode positioned on the semiconductor layer to make contact with the first source region and the second source region.

Preferably, the first base region and the second base region may be positioned to be adjacent to each other while being interdigitated with each other.

Preferably, the first source region and the second source region may be positioned to be adjacent to each other while being interdigitated with each other.

Preferably, a portion of the first base region may protrude toward the second base region, a portion of the second base region may protrude toward the first base region, and a region protruding from the first base region and a region protruding from the second base region may be positioned to be interdigitated with each other.

Preferably, a portion of the first source region may protrude toward the second source region, a portion of the second source region may protrude toward the first base region, and a region protruding from the first source region and a region protruding from the second source region may be positioned to be interdigitated with each other.

Preferably, a region protruding from the first base region and a region protruding from the second source region may be positioned to be overlapped with each other in a vertical direction.

Preferably, a region protruding from the first base region and a region protruding from the second source region may have an equal length and an equal width.

Preferably, a region protruding from the second base region and a region protruding from the first source region may be positioned to be overlapped with each other in the vertical direction.

Preferably, a region protruding from the second base region and a region protruding from the first source region may be positioned to have an equal length and an equal width.

Preferably, the first base region and the first source region may be positioned at opposite sides of the first gate to be symmetric to each other.

Preferably, the second base region and the second source region may be positioned at opposite sides of the second gate to be symmetric to each other.

According to another embodiment of the present disclosure, a power semiconductor device may include a semiconductor layer including silicon carbide (SiC), an NMOS transistor including a first gate, a first base region, and a first source region which are positioned inside the semiconductor layer, and a second gate, a second base region, and a second source region which are positioned inside the semiconductor layer and connected to the NMOS transistor in parallel.

Preferably, the first base region and the second base region may be positioned to be adjacent to each other while being interdigitated with each other.

Preferably, the first source region and the second source region may be positioned to make contact with the first base region and the second base region.

Preferably, the first source region and the second source region may be positioned to be adjacent to each other while being interdigitated with each other.

Preferably, a portion of the first base region may protrude toward the second base region, a portion of the second base region may protrude toward the first base region, and a region protruding from the first base region and a region protruding from the second base region may be positioned to be interdigitated with each other.

Preferably, a portion of the first source region may protrude toward the second source region, a portion of the second source region may protrude toward the first base region, and a region protruding from the first source region and a region protruding from the second source region may be positioned to be interdigitated with each other.

Preferably, a region protruding from the first base region and a region protruding from the second source region may be positioned to be overlapped with each other in a vertical direction.

Preferably, a region protruding from the second base region and a region protruding from the first source region may be positioned to be overlapped with each other in the vertical direction.

BRIEF DESCRIPTION OF THE FIGURES

The above and other objects, features and advantages of the present disclosure will be more apparent from the following detailed description taken in conjunction with the accompanying drawings.

DETAILED DESCRIPTION

Figure 1:
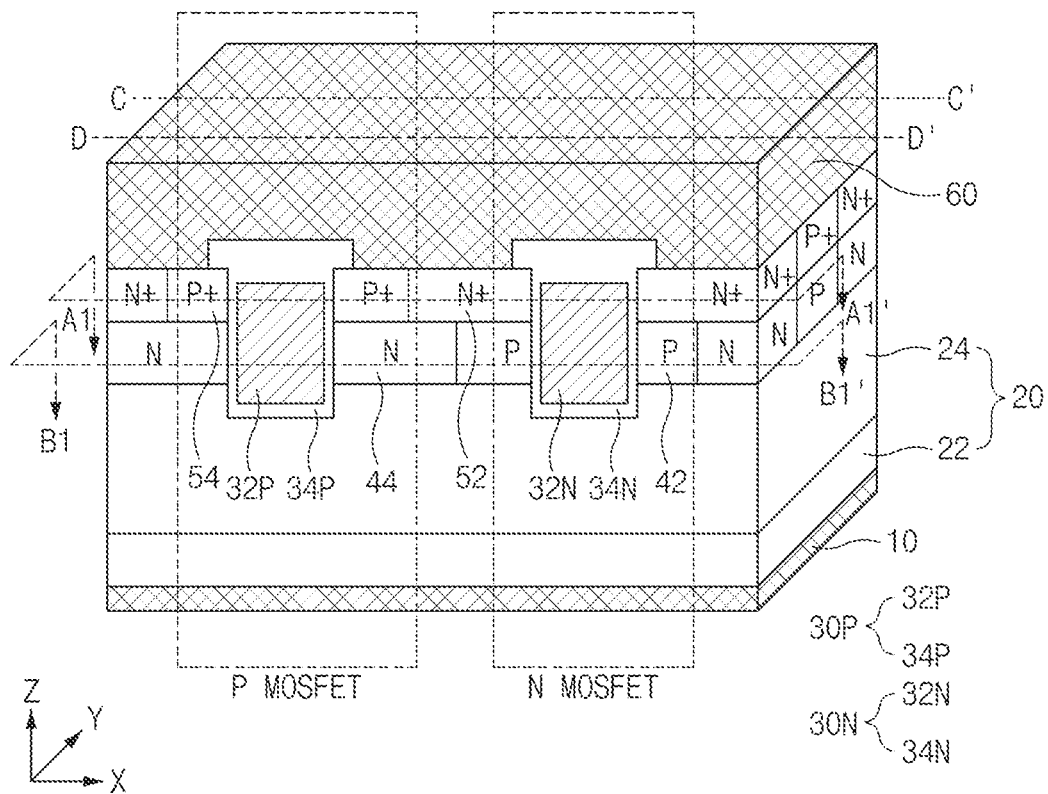
FIG. 1 is a perspective view schematically illustrating the structure of a power semiconductor device, according to an embodiment of the present disclosure.

Hereinafter, an embodiment of the present disclosure will be described in detail with reference to accompanying drawings. However, the present disclosure may be implemented in various different forms and should not be construed as being limited to embodiments to be disclosed below. Rather, these embodiments are provided as examples so that this disclosure will be thorough and complete and will fully convey the scope and spirit of the invention to one skilled in the art. For the convenience of explanation, some components in accompanying drawings may be exaggerated or reduced in size. The same reference numerals will be assigned to the same components in drawings.

Unless otherwise defined, all terms used herein are to be interpreted as commonly understood by one skilled in the art. In drawings, sizes of layers and regions are exaggerated for description, and are thus provided to describe normal structures of the present disclosure.

The same reference signs indicate the same components. It will be understood that, when a component, such as a layer, an region, or a substrate, is referred to as being "on" another component, the component can be "directly" or "indirectly" on the another component, or one or more intervening components may also be present between the component and the another component. On the other hand, when a first component is described as being "directly on" a second component, it is understood as any intermediate component is not interposed therebetween.

Figure 2:
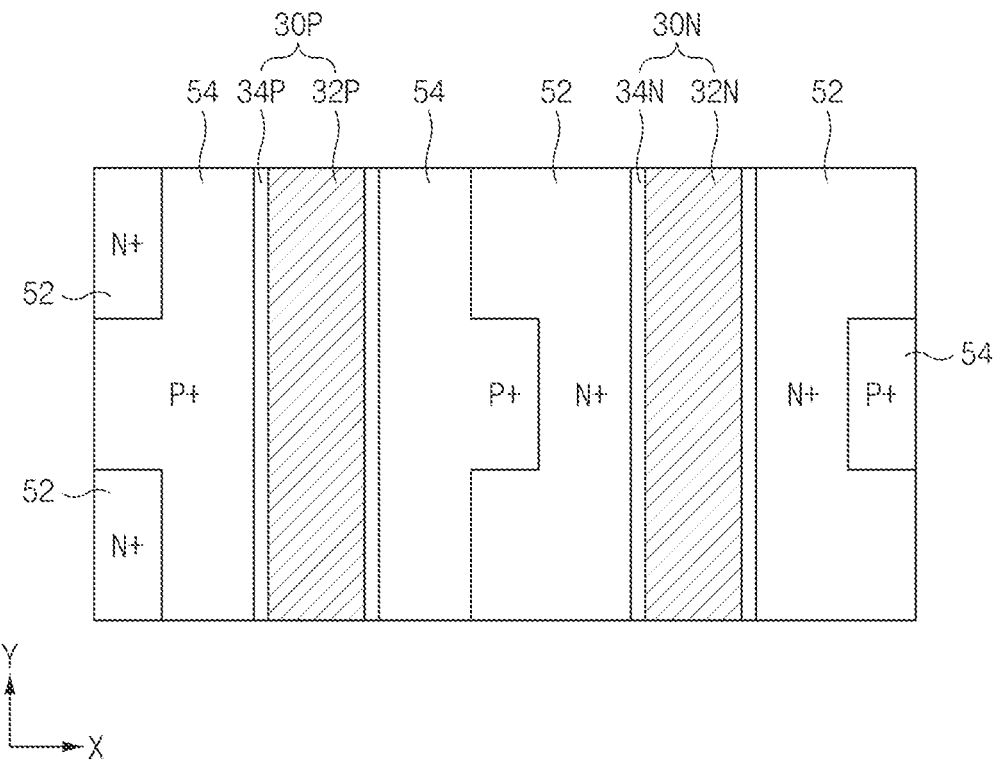
FIG. 2 is a plan view taken along line A1-A1' of FIG. 1.
Figure 3:
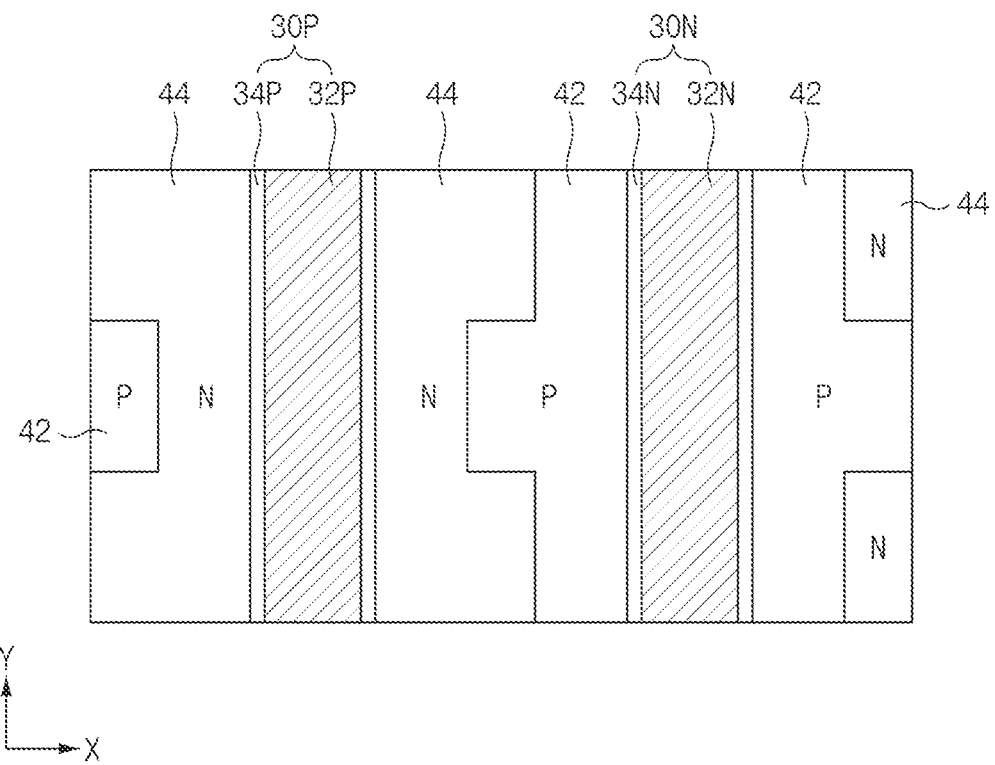
FIG. 3 is a plan view taken along line B1-B1' of FIG. 1.
Figure 4:
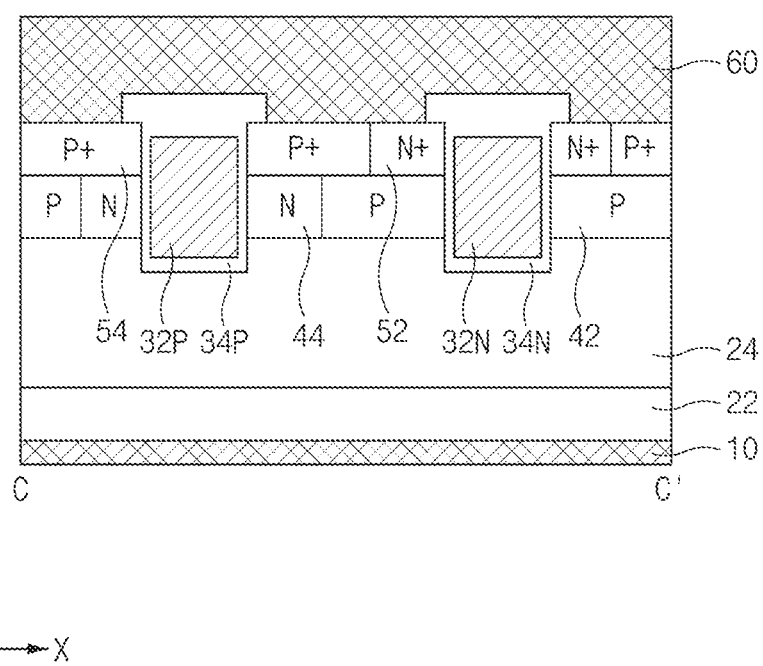
FIG. 4 is a cross-sectional view taken along line C-C' of FIG. 1.
Figure 5:
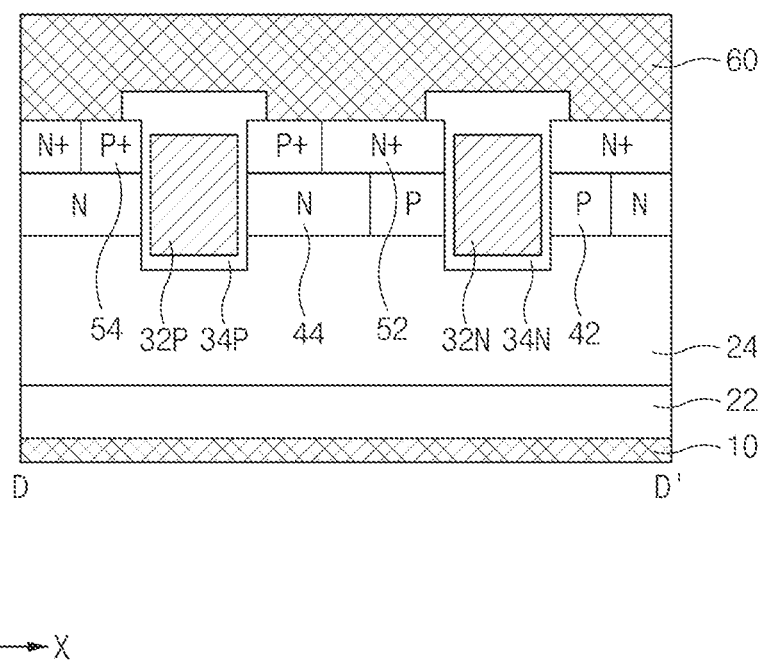
FIG. 5 is a cross-sectional view taken along line D-D' of FIG. 1.
Figure 6:
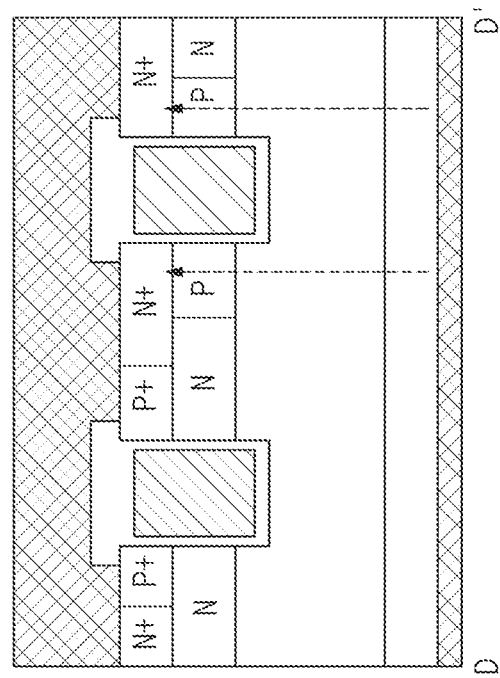
FIG. 6 is a view illustrating a current flowing in a forward direction.
Figure 6:
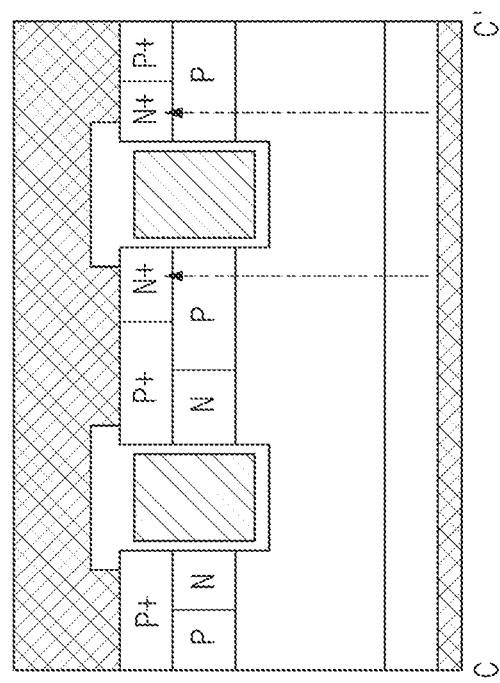

FIG. 1 is a perspective view schematically illustrating the structure of a power semiconductor device, according to an embodiment of the present disclosure; FIGS. 2 and 3 are plan views taken along lines A1-A1' and B1-B' of FIG. 1 by way of example, and FIGS. 4 and 5 are cross-sectional views taken along lines C-C' and D-D' of FIG. 1. In addition, FIGS. 6 and 7 are views illustrating the flow of a current in an NMOS transistor and a PMOS transistor.

Figure 7:
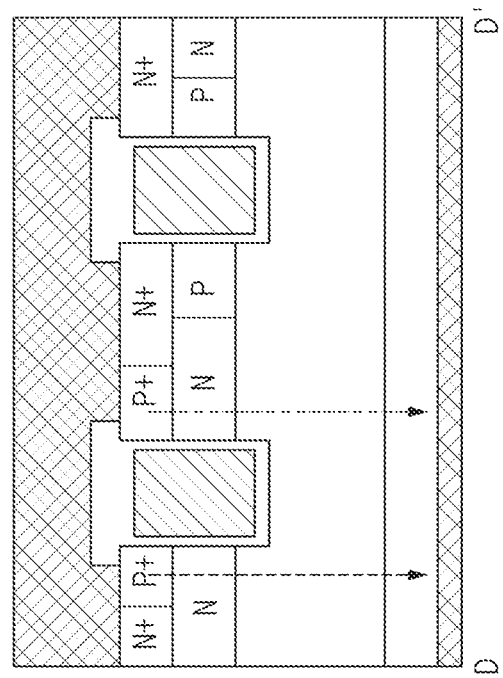
FIG. 7 is a view illustrating a current flowing in a reverse direction.
Figure 7:
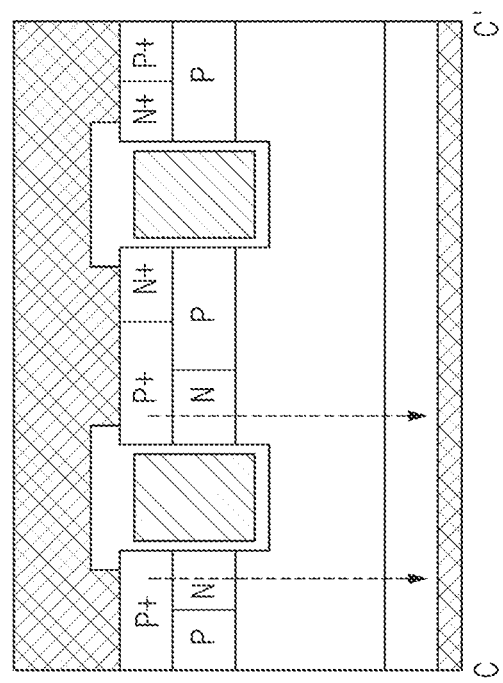

Referring to FIGS. 1 and 7, according to the present embodiment, the semiconductor device may include a drain electrode 10, a semiconductor layer 20, a first gate 30N, a second gate 30P, base regions 42 and 44, source regions 52 and 54, and a source electrode 60

The drain electrode 10 may be formed under the semiconductor layer 20 and may include a conductive material such as metal.

The semiconductor layer 20 may include one or a plurality of semiconductor material layers. The semiconductor layer 20 may include one or multiple epitaxial layers. For example, the semiconductor layer 20 may include one or multiple epitaxial layers on the semiconductor substrate. Alternatively, the semiconductor layer 20 may include a silicon carbide (SiC) substrate. Alternatively, the semiconductor layer 20 may include at least one SiC-epitaxial layer.

As silicon carbide (SiC) has a band gap higher than a band gap of silicon (Si), silicon carbide (SiC) may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device having the semiconductor layer 20 including silicon carbide (SiC) may exhibit a more excellent heat dissipation characteristic with a higher breakdown voltage, and may exhibit a stable operating characteristic at a higher temperature, when compared to the case employing silicon (Si)

The semiconductor layer 20 may include a semiconductor substrate 22 and a drift region 24 formed on the semiconductor substrate 22. The semiconductor substrate 22 and the drift region 24 may include N-type dopants. For example, the semiconductor substrate 22 and the drift region 24 may include N-type dopants doped at concentrations of N+ and N−, respectively. The semiconductor substrate 22 may include an SiC-substrate, and the drift region 24 may include an SiC-epitaxial layer obtained by growing the SiC-substrate. The drift region 24 may provide a moving path of a current, when the power semiconductor device operates.

The first gate 30N may include a first gate electrode 32N and a first gate insulating layer 34N.

The first gate electrode 32N may be formed to be buried in a gate trench formed by etching the semiconductor layer 20 by a specific depth. The first gate electrode 32N may be formed to be extended by a specific length in a vertical direction (a Z direction) from a top surface of the semiconductor layer 20. For example, the first gate electrode 32N may be formed to be extended by a length sufficient to pass through a p-base region 42 and a first source region 52 in the vertical direction. The first gate electrode 32N may form a vertical channel in the p-base region 42 such that a current flows from the drain electrode 10 to the first source region 52 in the vertical direction as in FIG. 6, when an on-voltage (+ voltage) is applied to the first gate electrode 32N. The first gate electrode 32N may be formed to be longitudinally extended in a Y direction while forming a line type. The first gate electrode 32N may include polysilicon implanted with dopants.

The first gate insulating layer 34N may surround the first gate electrode 32N. For example, the first gate insulating layer 34N may cover the entire portion including a side surface, a bottom surface, and a top surface of the first electrode 32N. The first gate insulating layer 34N may include an insulating material, such as a silicon oxide, an SiC oxide, a silicon nitride, a hafnium oxide, a zirconium oxide, or an aluminum oxide, or a stacked structure thereof.

The second gate 30P may be spaced apart in an X direction from the first gate 30N by a specific distance, and may include a second gate electrode 32P and a second gate insulating layer 34P.

The second gate electrode 32P may be buried in a gate trench formed by etching the semiconductor layer 20 by a specific depth. The second gate electrode 32P may be extended by a specific length in a vertical direction (a Z direction) from a top surface of the semiconductor layer 20. For example, the second gate electrode 32P may be extended by a length sufficient to pass through an n-base region 44 and a second source region 54 in the vertical direction. The second gate electrode 32P may form a vertical channel in the n-base region 44 such that a current flows to the drain electrode 54 from the second source region 10 in the vertical direction as in FIG. 7, when an off-voltage (− voltage) is applied to the second gate electrode 32P. The second gate electrode 32P may be formed to be longitudinally extended in a Y direction in parallel to the first gate electrode 32N while forming a line type. The second gate electrode 32P may include polysilicon implanted with dopants.

The second gate insulating layer 34P may surround the second gate electrode 32P. For example, the second gate insulating layer 34P may cover the entire portion including a side surface, a bottom surface, and a top surface of the second gate electrode 32P. The second gate insulating layer 34P may include an insulating material, such as a silicon oxide, an SiC oxide, a silicon nitride, a hafnium oxide, a zirconium oxide, or an aluminum oxide, or a stacked structure thereof.

The base regions 42 and 44 are regions for forming channels (vertical channels) allowing a current to move between the drift region 24 and the first source region 52, or between the drift region 24 and the second source region 54, when an operating voltage is applied to the first gate electrode 32N and the second gate electrode 32P. The base regions 42 and 44 may include a p-base region 42 and an n-base region 44.

The p-base region 42 may be formed by implanting P-type dopants into the drift region 24. The n-base region 44 may be adjacent to the p-base region 42 in the X direction, and may be formed by implanting N-type dopants into the drift region 24. P-base regions 42 may be positioned at opposite sides of the first gate 30N to make contact with the first gate 30N along the first gate 30N. N-base regions 44 may be positioned at opposite sides of the second gate 30P to make contact with the second gate 30P along the second gate 30P. Although the p-base region 42 makes contact with the n-base region 44 according to the present embodiment, the p-base region 42 and the n-base region 44 may be prevented from making contact with other. For example, the drift region 24 may be positioned between the p-base region 42 and the n-base region 44.

The p-base region 42 and the n-base region 44 interposed between the first gate 30N and the second gate 30P, which are adjacent to each other, may be partially interdigitated with each other, which is similar to threads engaged with each other. For example, as illustrated in FIG. 3, the p-base region 42 having a portion inserted into the n-base region 44 may include a region protruding to be convex toward the n-base region 44, when viewed in a plan view. In addition, the n-base region 44 having portions (regions at opposite sides of the protruding region of the p-base region in FIG. 3) inserted into the p-base region 42 may include regions protruding to be convex toward the p-base region 42, when viewed in a plan view. In this case, the protruding region of the p-base region 42 is interdigitated with protruding regions of the n-base region.

P-base region 42 interposed at opposite sides of the first gate 30N may be symmetrical to each other about the first gate 30N, and n-base regions 44 interposed at opposite sides of the second gate 30p may be symmetrical to each other about the second gate 30P.

The source regions 52 and 54 may be formed at an upper portion of the semiconductor layer 20 to make contact with the source electrode 60 and the base regions 42 and 44. The source regions 52 and 54 may include a first source region 52 and a second source region 54.

First source regions 52 may be positioned at opposite sides of the first gate 32N along the first gate 32N, and may make contact with the side surface of the first gate 32N while being positioned on the p-base region 42 and the n-base region to make contact with the p-base region 42 and the n-base region. The p-base region 52 may be formed by implanting N-type dopants into the drift region 24. Second source regions 54 may be positioned at opposite sides of the second gate 32P along the second gate 32P, and may make contact with the side surface of the second gate 32P while being positioned on the p-base region 42 and the n-base region to make contact with the p-base region 42 and the n-base region 44. Although the first source region 52 makes contact with the second source region 54 according to the present embodiment, the first source region 52 and the second source region 54 may be formed to be prevented from making contact with other. For example, the drift region 24 may be positioned between the first source region 52 and the second source region 54.

The first region 52 and the second region 54 interposed between the first gate 30N and the second gate 30P, which are adjacent to each other, may be partially interdigitated with each other, which is similar to threads engaged with each other. For example, as illustrated in FIG. 2, the second source region 54 having a form having a portion inserted into the first source region 52 may include a region protruding to be convex toward the first source region 52, when viewed in a plan view. In addition, the first source region 52 having portions (regions at opposite sides of the protruding region of the second source region 54 of FIG. 2) inserted into the second source region 54 may include regions protruding to be convex toward the second source region 54, when viewed in a plan view. In this case, the protruding region of the first source region 52 is interdigitated with protruding regions of the second source region 54.

The protruding region of the first source region 52 may be overlapped with the protruding region of the n-base region 44 in the vertical direction. In addition, the protruding region of the second source region 54 may be overlapped with the protruding region of the p-base region 42 in the vertical direction. In other words, the first source region 52 and the n-base region 44, which are in an N type, have protruding regions overlapped with each other in the vertical direction while making contact with each other, such that the first source region 52 is electrically connected to the n-base region 44. In addition, the second source region 54 and the p-base region 42, which are in a P type, have protruding regions overlapped with each other in the vertical direction while making contact with each other, such that the second source region 54 and the p-base region 42 are electrically connected to each other. Accordingly, when a current flows in the forward direction as illustrated in FIG. 6, a negative bias voltage may be applied to the p-base region 42 through the second source region 54. When a current flows in the reverse direction as illustrated in FIG. 7, a positive bias voltage may be applied to the n-base region 44 through the first source region 52. The regions protruding to be overlapped with each other may be equal in length and widths.

First source regions 52 interposed at opposite sides of the first gate 30N may be symmetrical to each other about the first gate 30N, and second source regions 54 interposed at opposite sides of the second gate 30p may be symmetrical to each other about the second gate 30P.

The source electrode 60 may be formed on the source regions 52 and 54 and the gates 30N and 30P to be connected to the first source region 52 and the second source region 54. The source electrode 60 may include a conductive material such as metal.

In the above configuration, the drain electrode 10, the semiconductor layer 20, the first gate 30N, the p-base region 42, the first source region 52, and the source electrode 60 may form an NMOS transistor (NMOSFET), and the drain electrode 10, the semiconductor layer 20, the second gate 30p, the n-base region 44, the second source region 54, and the source electrode 60 may form a PMOS transistor (MOSFET). The PMOS transistor PMOSFET and the NMOS transistor NMOSFET may be connected in parallel by the drain electrode 10, and the source electrode 60, and a pair of PMOS transistors PMOSFET and NMOS transistors NMOSFET connected in parallel may form one active cell. As described above, according to the present embodiment, in the active cell, a current may smoothly flow in the reverse direction as well as forward direction, as illustrated in FIGS. 6 and 7.

Although the above description has been made in that the base regions 42 and 44 and the source regions 52 and 54 are symmetrical to each other about the first gate 30N and the second gate 30P by way of example according to an embodiment, the base regions 42 and 44 and the source regions 52 and 54 may be formed only at one side of the gate. For example, the base regions 42 and 44, and the source regions 52 and 54 may be interdigitated with each other in only regions between the first gate 30N and the second gate 30P, as described above.

In addition, although the above description has been made in that one PMOS transistor (P MOSFET) and one NMOS transistor (N MOSFET) are paired to form one active cell according to an embodiment, the present disclosure is not limited thereto.

Since the PMOS transistor (P MOSFET) is to allow a current to smoothly flow in a reverse direction in the power semiconductor device, one PMOS transistor (P MOSFET) may be positioned every multiple NMOS transistors (N MOSFETs) to be connected in parallel with the multiple NMOS transistors (N MOSFETs). In this case, the number of NMOS transistors (N MOSFETs) connected to one PMOS transistor (P MOSFET) in parallel may be varied if necessary.

Figure 8:
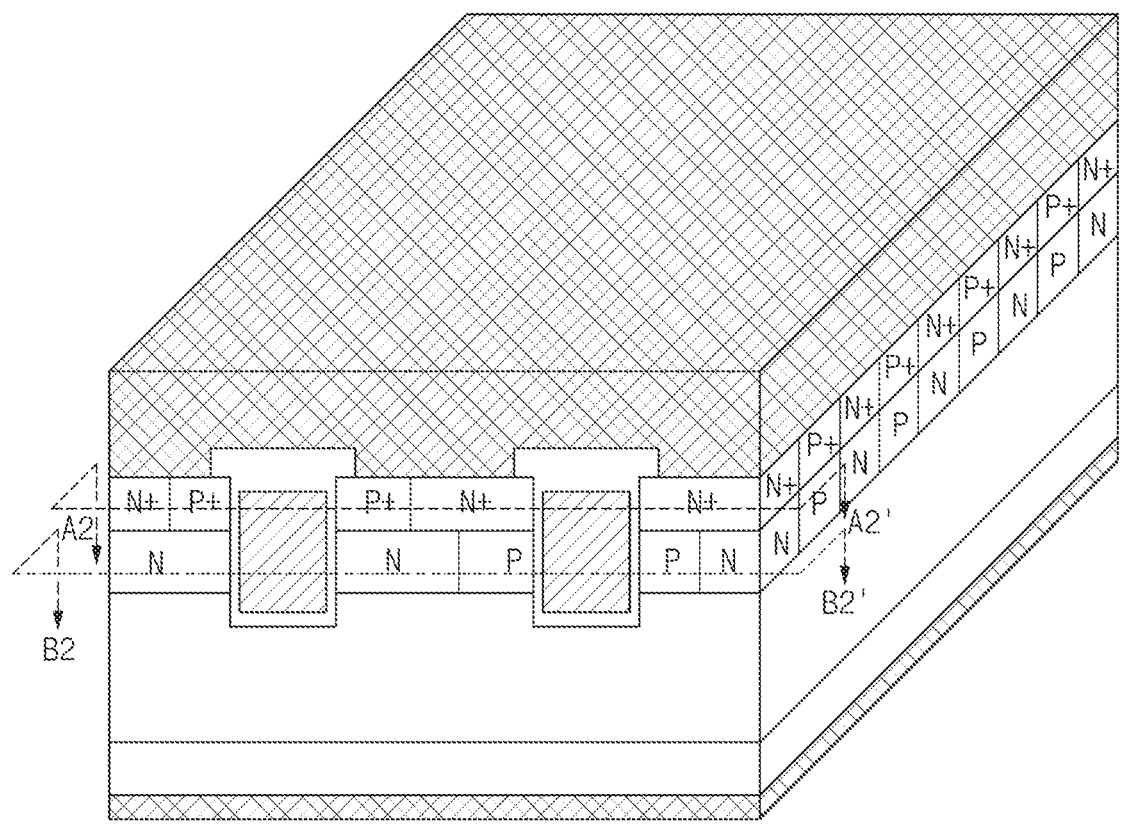
FIG. 8 is a perspective view schematically illustrating the structure of a power semiconductor device, according to another embodiment of the present disclosure.

FIG. 8 is a perspective view schematically illustrating the structure of a power semiconductor device, according to another embodiment of the present disclosure. In addition, FIG. 9A is a plan view taken along line A2-A2' of FIG. 8, and FIG. 9B is a plan view taken along line B-B2' of FIG. 8.

Figure 9A:
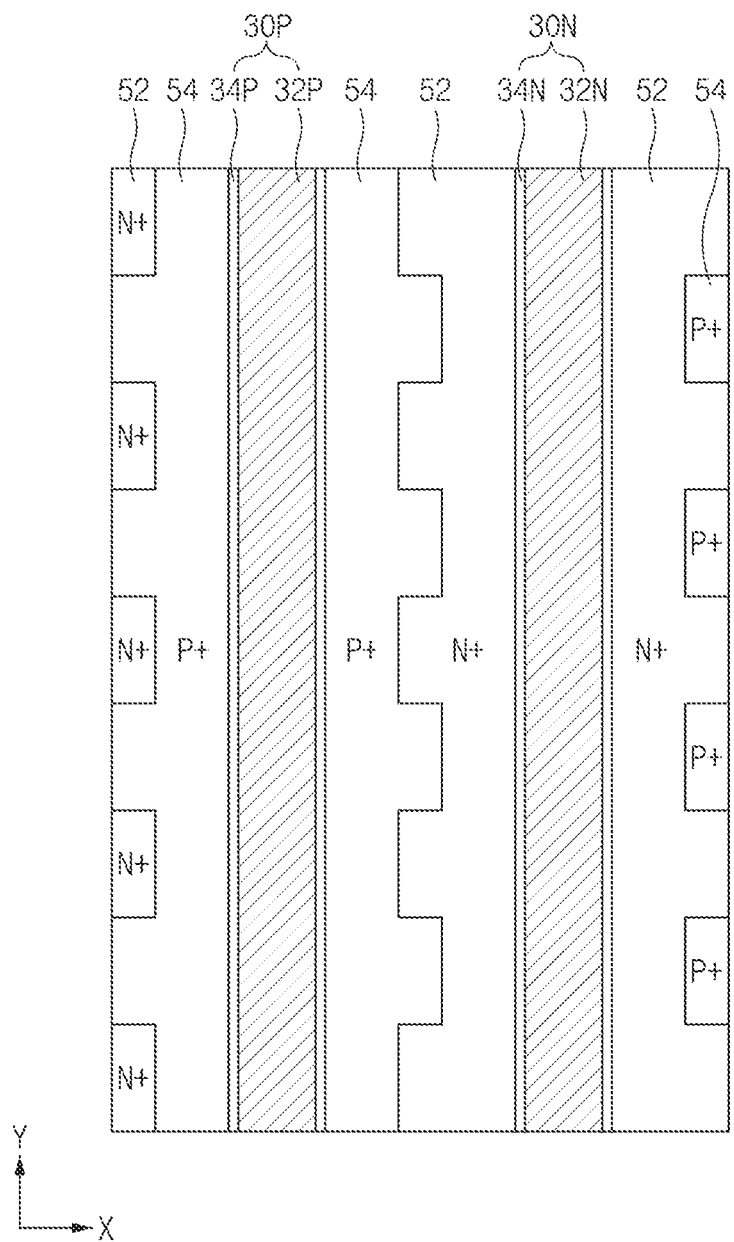
FIG. 9A is a plan view taken along line A2-A2' of FIG. 8.
Figure 9B:
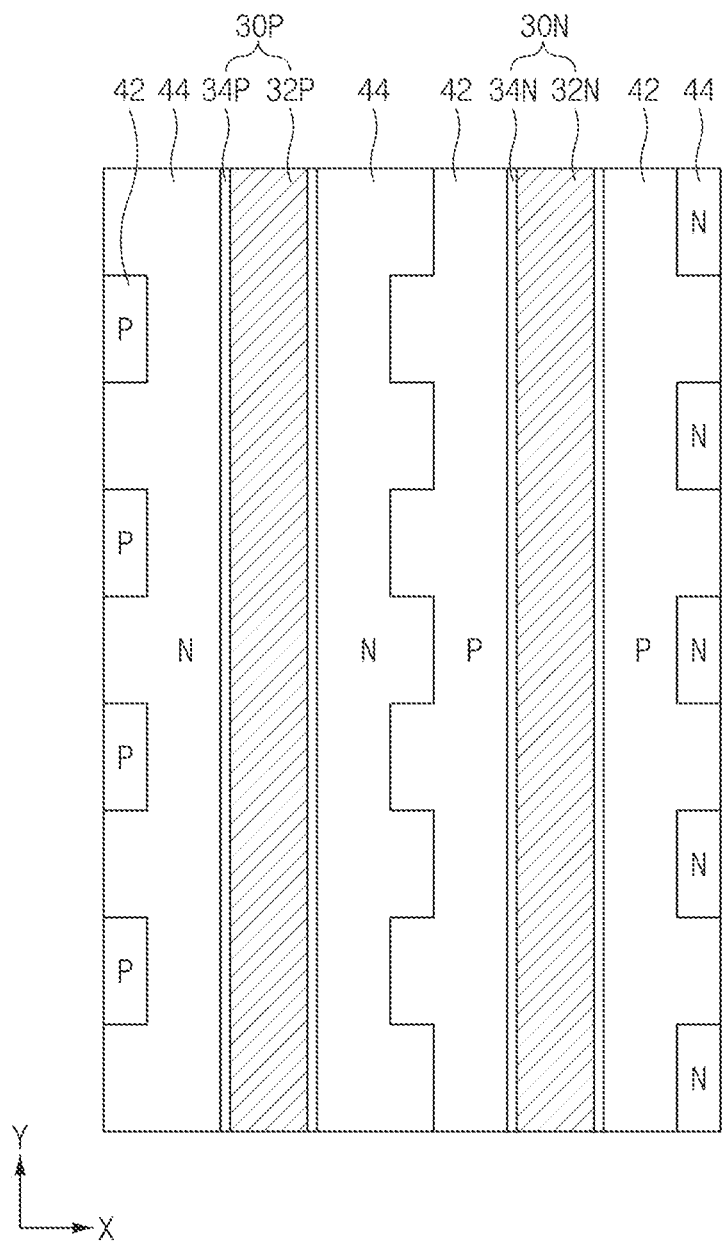
FIG. 9B is a plan view taken along line B-B2' of FIG. 8.

Referring to FIGS. 8, 9A, and 9B, the above-described structure of FIG. 1 may be formed in series in the Y direction.

In this case, the first source region 52 and the second source region 54 positioned between adjacent gates 30N and 30P may be formed while extending in the Y direction in the form in which the first source region 52 and the second source region 54 are interdigitated with each other in series, which is similar to threads engaged with each other. In addition, the p-base region 42 and the n-base region 44 interposed between adjacent gates 30N and 30P may also be formed to extend in the Y direction, in the form in which the p-base region 42 and the n-base region 44 are interdigitated with each other in the Y direction. In this case, the protruding region of the first source region 52 and the protruding region of the n-base region 44 may be electrically connected to each other while being overlapped with each other in the vertical direction, and the protruding region from the second source region 54 and the protruding region from the p-base region 42 are overlapped with each other in the vertical direction and electrically connected to each other.

Although FIG. 8 illustrates that active cells are positioned in series in the Y direction according to an embodiment, the power semiconductor device may include a structure in which a plurality of structures of FIG. 8 are positioned in series in the X direction.

FIGS. 10A to 10F are views illustrating the manufacturing process of the structure of FIG. 4. FIGS. 11A to 11F are views illustrating the manufacturing process of the structure of FIG. 5.

Figure 10A:
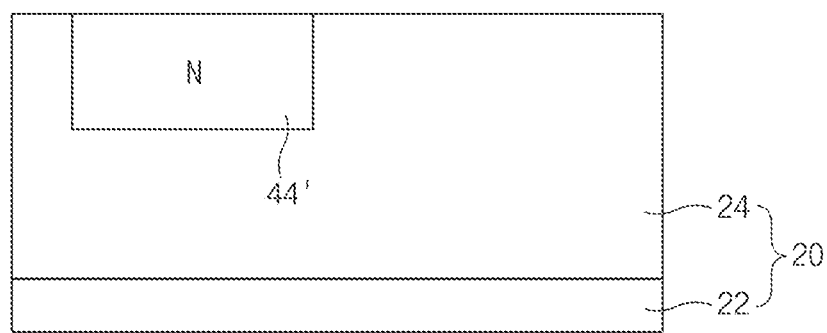
FIGS. 10A, 10B, 10C, 10D, 10E, and 10F are views illustrating the manufacturing process of the structure of FIG. 4.
Figure 11A:
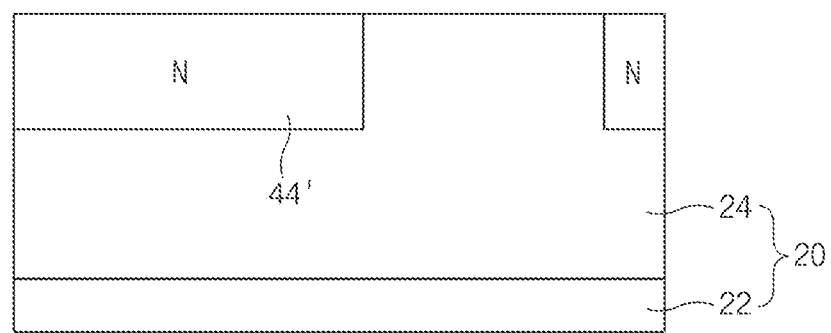
FIGS. 11A, 11B, 11C, 11D, 11E, and 11F are views illustrating the manufacturing process of the structure of FIG. 5.

First, referring to FIGS. 10A and 11A, an n-base expected region 44' may be formed by implanting N-type dopants to a specific depth of an upper portion of the drift region 24, in the semiconductor layer 20 including an SiC semiconductor substrate 22 and an SiC epitaxial layer (a drift region).

Figure 10B:
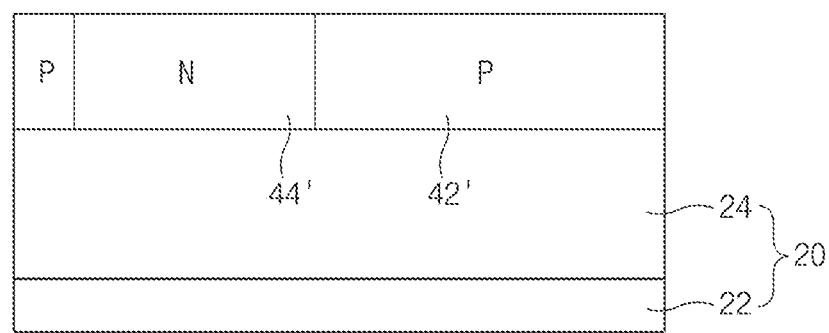
Figure 11B:
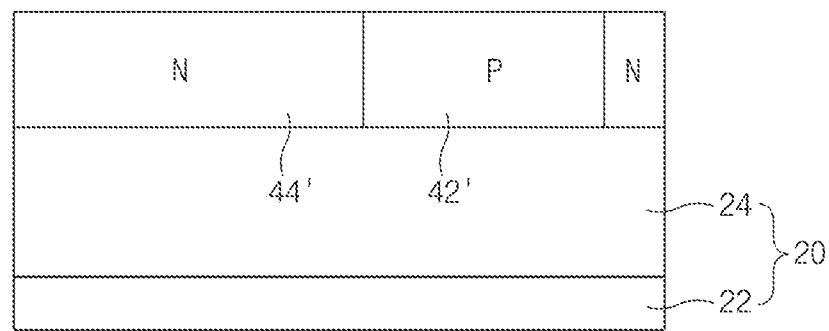

Next, referring to FIGS. 10B and 11B, a p-base expected region 42' may be formed by implanting P-type dopants into a region, which is adjacent to the n-base expected region 44', of the upper portion of the drift region 24. In this case, the p-base expected region 42' may make contact to or be slightly spaced apart from the n-base expected region 44', as illustrated in FIGS. 9B and 10B.

Figure 10C:
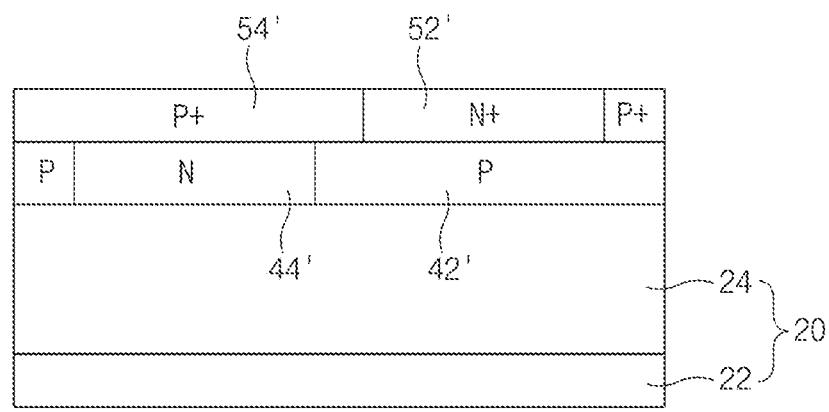
Figure 11C:
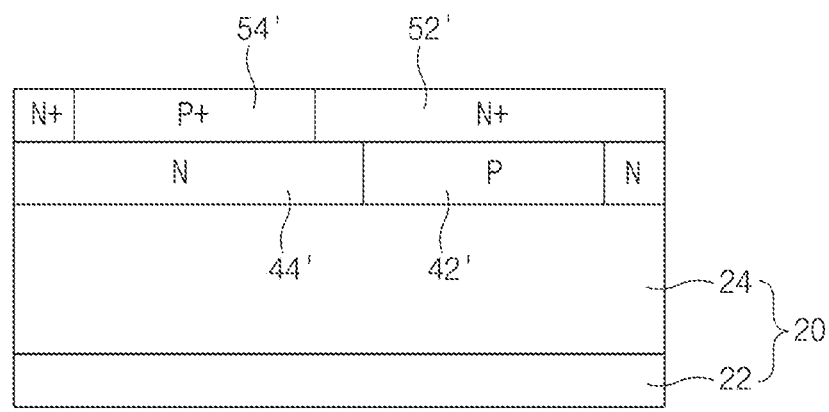

Thereafter, referring to FIGS. 10C and 11C, P-type dopants having a concentration (P+) higher than that of the p-base expected region 42' and N-type dopants having a concentration (N+) higher than that of the n-base expected region 44' are implanted into upper portions of the p-base expected region 42' and the n-base expected region 44' to form the first source expected region 52' and the second source expected region 54'.

Figure 10D:
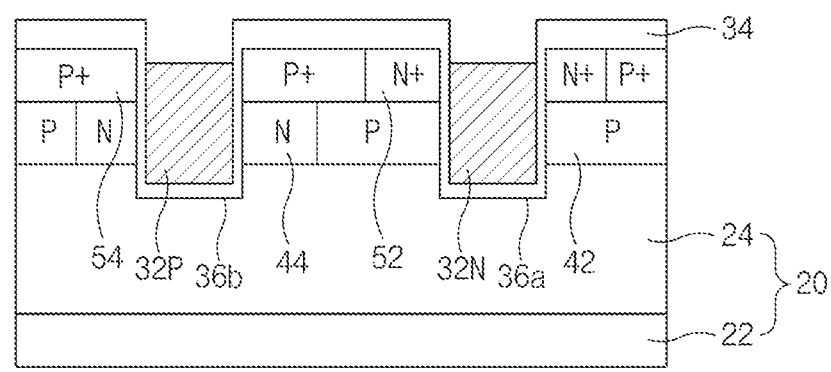
Figure 11D:
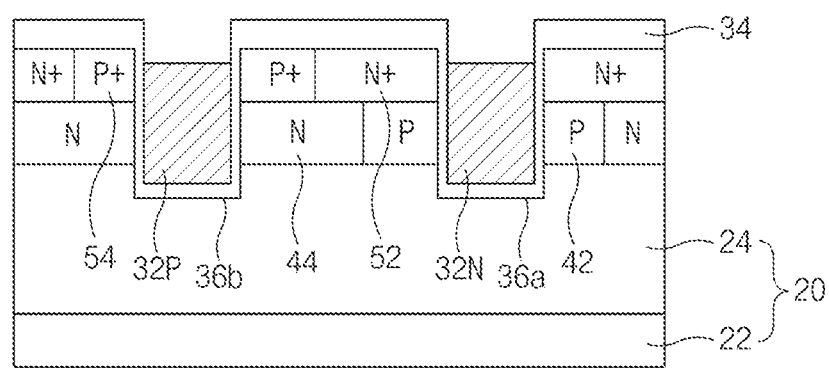

Next, referring to FIGS. 10D and 11D, the first trench 36a may be formed through the p-base expected region 42' and the first source expected region 52' and the second trench 36b may be formed through the n-base expected region 44' and the second source expected region 54'.

The p-base expected region 42' and the n-base expected region 44' are split left and right by the first trench 36a and the second trench 36b, thereby forming the p-base region 42 and the n-base region 44. In addition, the first source expected region 52' and the second source expected region 54' are split left and right by the first trench 36a and the second trench 36b, thereby forming the first source region 52 and the second source region 54.

Thereafter, the insulating layer 34 may be deposited on an inner surface (a side surface and a bottom surface) of the trenches 36a and 36b and a top surface of the drift region 24. The insulating layer 34 may include an insulating material, such as a silicon oxide, an SiC oxide, a silicon nitride, a hafnium oxide, a zirconium oxide, or an aluminum oxide, or a stacked structure thereof.

Subsequently, after forming a conductive material for a gate on the entire portion of the insulating layer 34, the gate conductive material is selectively removed from the upper portion of the drift region 24 through an etching process such as a planarization process, thereby forming the first gate electrode 32N and the second gate electrode 32P buried in the first trench 36a and the second trench 36b.

Figure 10E:
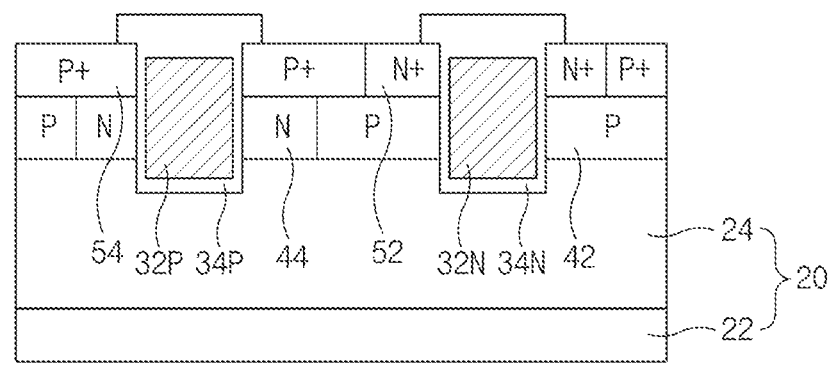
Figure 11E:
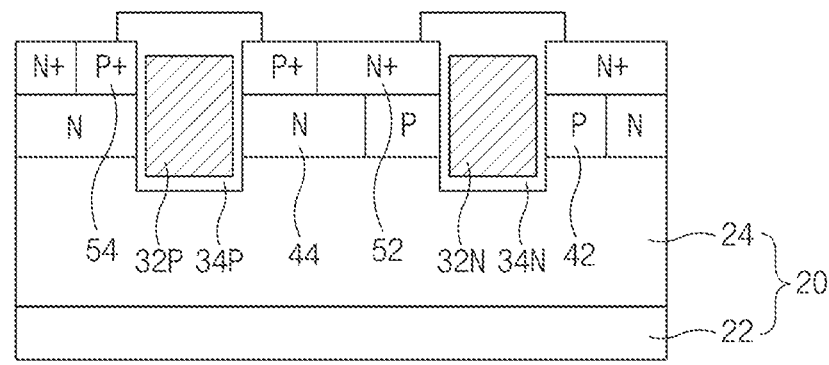

Next, referring to FIGS. 10E and 11E, after an insulating layer is additionally formed to cover the first gate electrode 32N and the second gate electrode 32P, the insulating layers are patterned, thereby forming the first gate insulating layer 34N and the second gate insulating layer 34P to surround the first gate electrode 32N and the second gate electrode 32P.

Figure 10F:
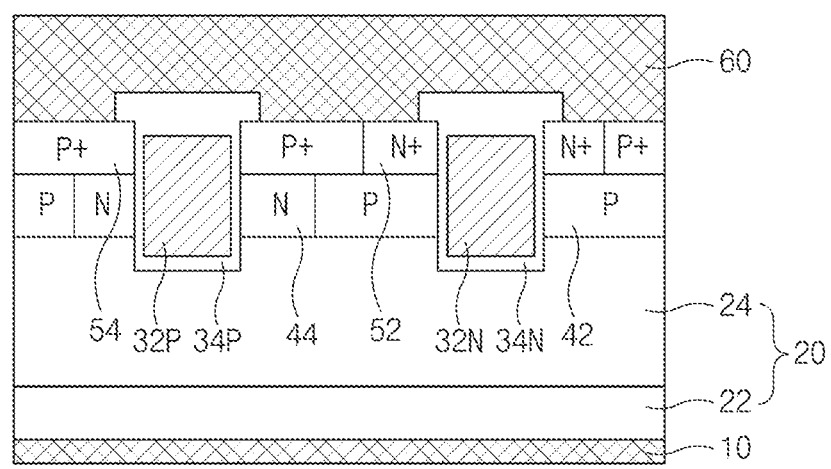
Figure 11F:
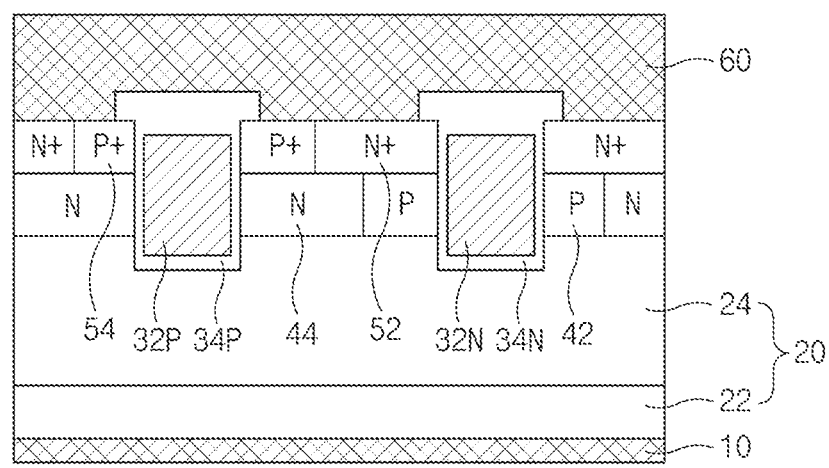

Thereafter, referring to FIGS. 10F and 11F, a conductive material (for example, metal) is formed on the first source region 52, the second source region 54, and the gate insulating layers 34N and 34P, thereby forming the source electrode 60, and a conductive material (for example, metal) may be formed under the semiconductor substrate 22, thereby forming the drain electrode 10.

According to an embodiment, the power loss may be reduced by allowing the current to smoothly flow in the forward direction or the reverse direction.

Of course, these effects are exemplary, and the scope of the present disclosure is not limited by these effects.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

The invention claimed is:

1. A power semiconductor device comprising:
   a semiconductor layer including silicon carbide (SiC);
   a first gate buried in the semiconductor layer;
   a second gate buried in the semiconductor layer and separated from the first gate;
   a first base region positioned at least at one side of the first gate and having a first conductive type;
   a second base region positioned at least at one side of the second gate and having a second conductive type opposite to the first conductive type;
   a first source region positioned at least at the one side of the first gate in contact with the first base region, and the second base region, and having the second conductive type;
   a second source region positioned at least at the one side of the second gate in contact with the first base region and the second base region, and having the first conductive type; and
   a source electrode positioned on the semiconductor layer in contact with the first source region and the second source region.

2. The power semiconductor device of claim 1, wherein the first base region and the second base region are adjacent to each other while being interdigitated with each other.

3. The power semiconductor device of claim 2, wherein the first source region and the second source region are adjacent to each other while being interdigitated with each other.

4. The power semiconductor device of claim 2, wherein a portion of the first base region protrudes toward the second base region,
   wherein a portion of the second base region protrudes toward the first base region, and
   wherein a region protruding from the first base region and a region protruding from the second base region are interdigitated with each other.

5. The power semiconductor device of claim 4, wherein a portion of the first source region protrudes toward the second source region,
   wherein a portion of the second source region protrudes toward the first base region, and
   wherein a region protruding from the first source region and a region protruding from the second source region are interdigitated with each other.

6. The power semiconductor device of claim 5, wherein a region protruding from the first base region and a region protruding from the second source region are overlapped with each other in a vertical direction.

7. The power semiconductor device of claim 5, wherein a region protruding from the first base region and a region protruding from the second source region have an equal length and an equal width.

8. The power semiconductor device of claim 5, wherein a region protruding from the second base region and a region protruding from the first source region are overlapped with each other in the vertical direction.

9. The power semiconductor device of claim 5, wherein a region protruding from the second base region and a region protruding from the first source region have an equal length and an equal width.

10. The power semiconductor device of claim 1, wherein the first base region and the first source region are positioned at opposite sides of the first gate, and are symmetric to each other.

11. The power semiconductor device of claim 1, wherein the second base region and the second source region are positioned at opposite sides of the second gate, and are symmetric to each other.

12. A power semiconductor device comprising:
   a semiconductor layer including silicon carbide (SiC);
   an NMOS transistor including a first gate, a first base region, and a first source region which are positioned inside the semiconductor layer; and a PMOS transistor including a second gate, a second base region, and a second source region which are positioned inside the semiconductor layer and connected to the NMOS transistor in parallel.

13. The power semiconductor device of claim 12, wherein the first base region and the second base region are adjacent to each other while being interdigitated with each other.

14. The power semiconductor device of claim 12, wherein the first source region and the second source region make contact with the first base region and the second base region.

15. The power semiconductor device of claim 14, wherein the first source region and the second source region are adjacent to each other while being interdigitated with each other.

16. The power semiconductor device of claim 13, wherein a portion of the first base region protrudes toward the second base region, wherein a portion of the second base region protrudes toward the first base region, and wherein a region protruding from the first base region and a region protruding from the second base region are interdigitated with each other.

17. The power semiconductor device of claim 16, wherein a portion of the first source region protrudes toward the second source region, and a portion of the second source region protrudes toward the first base region, and wherein a region protruding from the first source region and a region protruding from the second source region are interdigitated with each other.

18. The power semiconductor device of claim 17, wherein a region protruding from the first base region and a region protruding from the second source region are overlapped with each other in a vertical direction.

19. The power semiconductor device of claim 17, wherein a region protruding from the second base region and a region protruding from the first source region are overlapped with each other in the vertical direction.

* * * * *